Jan. 28, 1964 W. N. CARROLL ETAL 3,119,983

TIME PULSE DISTRIBUTOR

Filed May 29, 1959 4 Sheets-Sheet 1

INVENTORS
WILLIAM N. CARROLL,
DONALD J. HINKEIN,

BY Thomas & Crickenberger

ATTORNEYS

TIME PULSE DISTRIBUTOR

Filed May 29, 1959 4 Sheets-Sheet 2

INVENTORS
WILLIAM N. CARROLL,
DONALD J. HINKEIN,
BY Thomas & Crickenberger
ATTORNEYS INVENTORS
WILLIAM N. CARROLL,
DONALD J. HINKEIN,
BY Thomas & Crickenberger
ATTORNEYS Jan. 28, 1964 W. N. CARROLL ETAL 3,119,983

TIME PULSE DISTRIBUTOR

Filed May 29, 1959 4 Sheets-Sheet 4

INVENTORS
WILLIAM N. CARROLL,
DONALD J. HINKEIN,

BY Thomas & Crickenberger

ATTORNEYS

United States Patent Office 3,119,983

Patented Jan. 28, 1964

3,119,983

TIME PULSE DISTRIBUTOR

William N. Carroll, Rhinebeck, and Donald J. Hinkein, Germantown, N.Y., assignors to International Business Machines Corporation, New York, N.Y., a corporation of New York Filed May 29, 1959, Ser. No. 816,845
2 Claims. (Cl. 340—173)

This invention relates to an electrical timing device and more particularly to a time pulse distributor.

In electrical computing devices as well as in various other electrical machines time pulse distributors are employed where it is desired to take pulses from a single pulse source and establish pulses on each one of a plurality of output conductors sequentially. Previous devices for this purpose normally include a group of stages with each stage having at least two unilateral conducting devices either of which may be rendered conductive. The stages may be connected in a ring circuit to operate continuously in response to input pulses and thereby pulse each output conductor successively as the ring is operated through a complete cycle. Alternatively, the stages may be connected in series with the last stage not connected to the first stage in which case the first stage is set and the distributor progresses through one cycle and stops, each stage providing an output pulse as the distributor progresses through a cycle of operation.

Earlier devices employed as pulse distributors usually include at least two unilateral conducting devices, one or the other being conductive at all times, in each stage with some sort of coupling arrangement between stages. Typically, pulses applied to all stages simultaneously operate one stage to change from one stable state to the opposite stable state, thereby providing an output pulse from this stage which energizes one of the plurality of output conductors and changes the condition of the adjacent stage so that the adjacent stage likewise may be operated by a subsequent pulse. The construction of each stage is characterized generally by a complex arrangement of numerous components which involve a large expenditure of power, require D.C. bias sources to control each unilateral conducting device, and operate at relatively low speeds. Further, the operation of such distributors usually cannot be suspended during a cycle of operation unless elaborate controls are provided, and then only at predetermined stages as a rule.

These and other disadvantages are overcome by the present invention which provides a time pulse distributor that eliminates the need for a D.C. bias source for control purposes in each stage, dispenses with the need for the customary flip-flop or trigger circuits, requires relatively few components, operates at relatively high speeds, and may be stopped at any stage in its cycle of operation for an indefinite period of time and started again at this stage. The reduction in the number of components decreases the amount of power consumed, increases the reliability of operation and minimizes the cost of manufacture and repair. Furthermore, a time pulse distributor according to this invention has added flexibility for control purposes since logic circuits such as OR, AND, INHIBIT and HOLD circuits readily may be employed. Any one or more of such circuits may be incorporated in any stage or any number of stages of the time pulse distributor.

More specifically, one arrangement according to this invention includes a time pulse distributor having a group of stages with each stage including a signal storage element, a discharging circuit for discharging the signal storage element, a charging circuit responsive to input pulses for charging the signal storage device and providing an output pulse, and a delay unit coupled between the output of one stage and the discharging circuit in the adjacent stage. The signal storage element in each stage is preferably a condenser, and the discharging circuit for the condenser is preferably, though not necessarily, a transistor. The charging circuit for the condenser also may include a transistor which is connected to a source of operating potential, and this transistor in each stage may be operated by input pulses, commonly referred to as clock pulses.

Initially, all condensers except one are charged with a signal of such magnitude and polarity as to render the transistor in the charging circuit nonconductive even when clock pulses are applied. The one condenser which is not charged permits the transistor in the charging circuit to become conductive in response to the next clock pulse, thereby charging the condenser and developing an output pulse from this stage. The charge on the condenser thus disables this stage from passing subsequent clock pulses, and the output signal from this stage is applied through a delay unit to operate the discharging transistor in the subsequent stage, thereby discharging the condenser in the next stage. The delay unit insures that the condenser in the adjacent stage is discharged subsequent to the termination of a clock pulse. The time pulse distributor accordingly continues in like fashion to operate each stage successively in response to subsequent clock pulses.

It is readily seen therefore that each stage has a condenser, and all condensers except one are charged initially to inhibiting operation of these stages by clock pulses. The condenser in a stage which is to pass the next clock pulse is discharged prior to the arrival of the clock pulse. The clock pulse passed by this stage charges the condenser thereby disabling this stage to subsequent clock pulses, and the charging of the condenser causes an output pulse to be developed from this stage. The output pulse is applied to a load device and to a delay network in the succeeding stage where the pulse is delayed until the clock pulse disappears. The delayed pulse is applied to the next stage where a discharging transistor is operated to discharge the condenser and condition this stage to pass the next clock pulse. Since the condenser in each stage controls the operation of the time pulse distributor and since each condenser is charged in response to clock pulses after being initially set, the need for a conventional battery type D.C. bias is avoided. A time pulse distributor of this type may be operated at speeds in the neighborhood of 10 megacycles per second.

According to a further arrangement of this invention each of the above described stages further includes a holding circuit provided with a control element that may be a transistor connected between the condenser of each stage and a source of operating potential. The holding transistor responds to hold pulses and charges the condenser if the condenser is in the discharged state. If the condenser were previously charged, the hold pulse replaces any leakage which may occur between pulses. In case the condenser was previously discharged, the hold pulse operates the hold transistor and charges the condenser so as to block the passage of a subsequent clock pulse. When the holding transistor conducts, an output signal is developed which is applied to a delay unit of the same stage, and the output signal from the delay unit operates the discharging transistor and discharges the condenser. The hold pulse in each case precedes the clock pulse by sufficient time to render the hold circuit effective before the clock pulse arrives. So long as hold pulses are applied in this manner, a holding operation may continue for an indefinite period of time.

According to a further arrangement of this invention, logical AND and OR circuits may be disposed between stages of such a time pulse distributor for the purpose of providing added flexibility of control. Either or both of such logical circuits may be disposed between the stages of a time pulse distributor, and such logical circuits may be employed between as many stages as desired. The output of such logical circuits is coupled to the discharging transistor in each stage, and consequently the logical circuits serve to condition the associated stage to pass the next clock pulse. When an OR circuit is employed, any one of its plurality of inputs may be coupled to the output of a preceding stage. Additional inputs to the OR circuit may receive control pulses from other devices and thereby operate the associated stage of the time pulse distributor. An AND circuit may provide a similar control action, but each of its multiple inputs must be energized simultaneously.

According to a further arrangement of this invention, an inhibit circuit may be utilized in one or more stages of a time pulse distributor. The inhibit circuit includes a control element which may be a transistor connected between the condenser of the associated stage and a source of operating potential. The inhibit transistor responds to inhibit pulses to charge the condenser and thereby disable this stage from passing subsequent clock pulses. When it is desired to terminate the inhibit operation, inhibit pulses are no longer applied. If the condenser is discharged prior to the inhibit operation, it is necessary to discharge the condenser upon termination of the inhibit operation. For this purpose a discharging device which may be a transistor is disposed in parallel with the condenser and responds to a set pulse to render the discharging transistor conductive and thereby discharge the condenser. Accordingly, this stage is conditioned to pass the next clock pulse, and the inhibit operation is terminated.

These and other features of this invention may be more fully appreciated when considered in light of the following description and the drawings in which.

Figure 1:
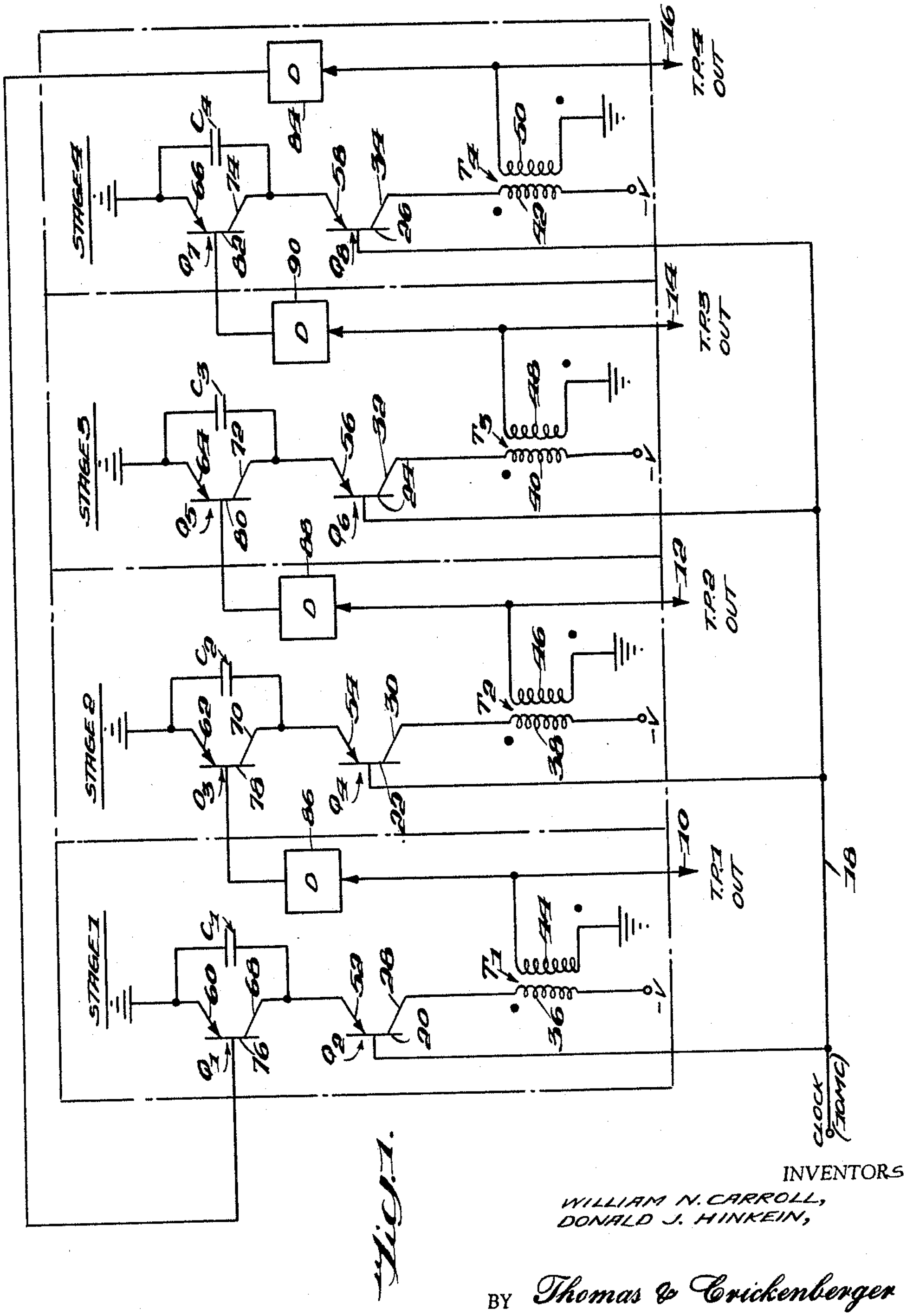
FIG. 1 illustrates a four stage time pulse distributor according to this invention which is connected in the form of a ring circuit.

Referring first to FIG. 1, a time pulse distributor is shown which consists of a ring circuit having output terminals 10, 12, 14 and 16 that are successively energized with output pulses in response to a train of input pulses applied to a line 18. The input pulses are applied to base electrodes 20, 22, 24 and 26 of respective transistors Q2, Q4, Q6 and Q8. Each of these transistors has a corresponding collector electrode 28, 30, 32 and 34 connected through associated transformer primary windings 36, 38, 40 and 42 to a negative voltage source. Each of these primary windings is coupled with a stepdown ratio of approximately 8 to 1 to respective secondary windings 44, 46, 48 and 50. Each of the transistors has corresponding emitter electrodes 52, 54, 56 and 58 which are connected through associated condensers C1, C2, C3 and C4 to ground. Transistors Q1, Q3, Q5 and Q7 are connected in shunt across respective condensers C1, C2, C3 and C4. Emitter electrodes 60, 62, 64 and 66 are connected to the grounded side of the associated condenser C1, C2, C3 and C4; whereas, collector electrodes 68, 70, 72 and 74 of associated transistors Q1, Q3, Q5 and Q7 are connected to the opposite terminals of the associated condensers C1, C2, C3 and C4. Base electrodes 76, 78, 80 and 82 are connected through delay networks 84, 86, 88 and 90 respectively to the output terminals 16, 10, 12 and 14 respectively.

In order to illustrate the operation of the time pulse distributor in FIG. 1, let it be assumed that condensers C2, C3 and C4 are charged sufficiently negative so that the transistors Q4, Q6 and Q8 are maintained nonconductive even when input pulses are applied to the conductor 18. Assume further that the condenser C1 is discharged. With the condenser C1 discharged the transistor Q2 does not conduct, but it is conditioned to pass the next pulse applied to the conductor 18. If negative clock pulses are applied to the conductor 18, the first of such pulses drives the base 20 of the transistor Q2 negatively, rendering this transistor conductive. Current flows from ground through condenser C1, the transistor Q2, and the primary winding 36 of transformer T1 to the negative voltage source, thereby charging the condenser C1 negatively. An output pulse is developed in the secondary winding 44 as the condenser C1 charges, and this pulse is applied to the output terminal 10 and to the delay unit 86. The output pulse applied to the terminal 10 is referred to as time pulse 1 (T.P.1). The output pulse applied to the delay unit 86 is delayed therein until the first clock pulse disappears from the conductor 18 at which time the delayed pulse is applied to the base electrode 78 of the transistor Q3. The pulse applied to the base 78 of the transistor Q3 is a negative pulse which causes this transistor to conduct, preferably in the saturation region. As a consequence, the condenser C2 is discharged, and remains discharged after the negative pulse disappears from the base 78 of transistor Q3 because the transistor Q4 remains nonconductive during the period of time that the transistor Q3 is conductive. At this point in time the condenser Q2 is discharged, and the condensers C1, C3 and C4 are negatively charged.

When the second clock pulse is applied to the conductor 18, the base electrodes 20, 22, 24 and 26 are driven negatively, but the condensers C1, C3 and C4 are charged negatively and maintain the transistors Q2, Q6 and Q8 nonconductive. However, because the condenser C2 holds no charge the transistor Q4 is rendered conductive, and current flows from ground through the condenser Q2, the transistor Q4, and the primary winding 38 to the negative voltage supply. Accordingly, the condenser C2 is charged negatively and a pulse is induced in the secondary winding 46 which appears as an output pulse at the terminal 12. This output pulse is applied to the delay unit 88 where it is delayed until the clock pulse disappears from the conductor 18 at which time the transistor Q5 is rendered conductive and the condenser C3 discharged.

It is readily seen from the foregoing explanation that the third clock pulse is passed by the transistor Q6 to the output terminal 14. In the process the condenser C3 is charged negatively to disable the stage 3 from passing further clock pulses, and the delayed output pulse is applied to the transistor Q7 to discharge the condenser C4 and condition stage 4 to pass the next clock pulse.

The fourth clock pulse is passed by the transistor Q8 to the output terminal 16, and this output pulse is delayed in the delay unit 84 until the fourth clock disappears from the conductor 18 at which time the delayed pulse renders transistor Q1 conductive, thereby discharging the condenser C1 and conditioning stage 1 so that it will pass the fifth clock pulse. This process continues in like fashion with subsequent clock pulses applied to the conductor 18 causing the terminals 10, 12, 14 and 16 to be energized in succession.

If PNP transistors are employed, one suitable type may be the graded base drift transistor of the junction type which is commercially available as the Philco T. 1231 transistor. The transistors employed in the circuit of FIG. 1 may be of the PNP type. When such transistors are used, negative clock pulses and negative voltage sources are employed. It is to be understood that transistors of the NPN type may be used in which case the clock pulses should be positive and the voltage sources connected to the emitter electrodes of the transistors Q2, Q4, Q6 and Q8 should be positive.

The transistors employed in FIG. 1 preferably have a gain of approximately 10. The transistors Q2, Q4, Q6 and Q8 are operated in the linear region while the transistors Q1, Q3, Q5 and Q7 are operated in the saturation region. The negative clock pulses applied to the line 18 in FIG. 1 may have a repetition rate in excess of 10 megacycles per second in the form of half sine waves having maximum pulse widths of 40 millimicroseconds. The negative voltage sources connected to the transistors Q2, Q4, Q6 and Q8 may be on the order of ten volts with current flow through the associated primary windings 36, 38, 40 and 42 being approximately 20 milliamperes. The transformer primary and secondary windings have a step-down ratio of 8 to 1, and the output pulse to the terminals 10, 12, 14 and 16 are approximately one volt negative. The condensers C1, C2, C3 and C4 are charged negatively approximately 1 volt. The period of delay between application of a clock pulse on the line 18 and the appearance of an output pulse at terminals 10, 12, 14 or 16 may be on the order of fifteen millimicroseconds.

Accordingly, it is seen that the circuit in FIG. 1 is operated at high speeds and uses relatively small amounts of power, and the total number of circuit elements has been reduced to a minimum. Furthermore, the need for D.C. bias sources for control purposes is eliminated. In this connection it is pointed out that operating potential for the transistors Q2, Q4, Q6 and Q8 is derived from the negative voltage sources connected to respective emitter electrodes 28, 30, 32 and 34; whereas, the clock pulses on the line 18, in conjunction with the control action of the delayed output pulse from the preceding cycle, determine the charge or discharge status of the condensers C1 through C4. It is recalled that one of these condensers is always discharged prior to the arrival of each clock pulse to permit a pulse to be developed at one of the output terminals 10, 12, 14 or 16 as explained above. It is equally important that each of the condensers which is negatively charged be maintained at a sufficiently negative level to insure that the associated transistors Q2, Q4, Q6 or Q8 are disabled. For this purpose the pulse repetition rate of the clock pulses applied to the conductor 18 should be sufficiently high so that once a condenser is negatively charged, it maintains a negative voltage level to block current conduction in the associated transistor Q2, Q4, Q6 or Q8 until operated in the next cycle of operation. Good design practice should take into consideration among other things the size of the condensers employed, the leakage resistance involved, the magnitude of the control voltage which must be maintained and the pulse repetition rate of the clock pulses. Should one or more of the condensers discharge to a voltage level below that which is needed to maintain the associated transistors Q2, Q4, Q6 or Q8 nonconductive, there is an inherent safety feature in that associated ones of the transistors Q2, Q4, Q6 or Q8 may conduct for a slight period of time and thereby charge the associated condenser to the cut-off voltage level. Because the time duration and the magnitude of such current conduction is very small, substantially no output signal is developed on the output terminals 10, 12, 14 or 16. Thus it is seen that the time pulse distributor circuit in FIG. 1 is efficient in operation and highly reliable.

Figure 2:
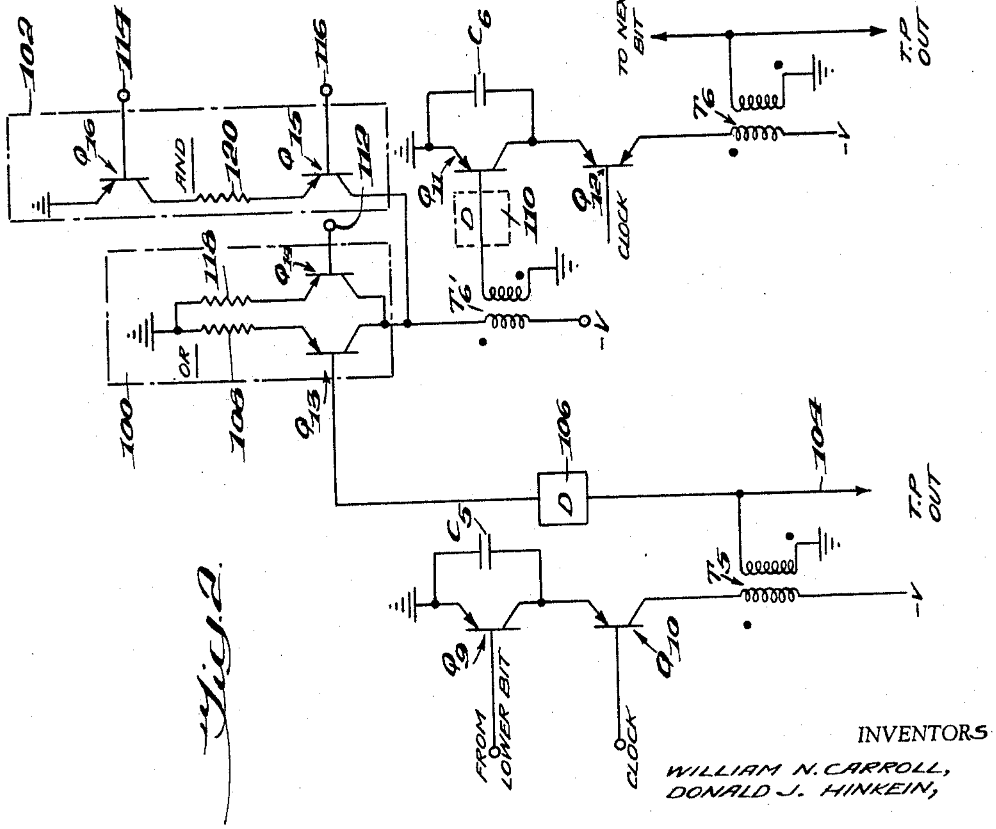
FIG. 2 illustrates a ring circuit such as illustrated in FIG. 1 but having a logical AND and a logical OR circuit disposed between stages.

Reference is made to FIG. 2 for a description of logical circuits employed for control purposes between stages of a distributor employing the principles of the present invention. The OR circuit 100 and the AND circuit 102 serve as logical control elements disposed between two stages of a time pulse distributor or ring circuit wherein the first stage includes transistors Q9 and Q10 with associated condenser C5 and transformer T5; whereas the second stage includes transistors Q11 and Q12 with associated condenser C6 and transformer T6. The performance of the first stage including the transistors Q9 and Q10 and the performance of the second stage including transistors Q11 and Q12 is the same as explained above with respect to FIG. 1. The OR circuit 100 and the AND circuit 102 provide an added degree of flexibility where such is desired. This flexibility is often needed in computing devices and information handling systems, particularly in the control portions thereof.

The OR circuit 100 and the AND circuit 102 do not interfere with the normal operation of a pulse distributor. To illustrate this, assume that a clock pulse to transistor Q10 causes an output pulse to be developed in the secondary winding of transformer T5. This pulse is applied to an output terminal 104 and to a delay circuit 106 where the pulse is delayed for reasons explained with respect to FIG. 1. The delayed pulse is applied to the base electrode of transistor Q13, causing this transistor to conduct; whereupon, current flows from ground through resistor 108, the transistor Q13 and the primary winding of transformer T6' to the negative source of operating potential. A delay circuit 110 may be disposed between the secondary winding of transformer T6' and the base electrode of transistor Q11 in which case the delay circuit 106 is omitted, but this is not essential in some cases and the delay circuit 110 is therefore shown in dotted block form. One instance where delay unit 110 may be required is where the AND circuit 102 is operated by pulses which are in synchronism with the clock pulses. In this case the delay circuit 110 is needed because, as explained with reference to the time pulse distributor in FIG. 1, the discharge of the condenser C6 must take place after the clock pulse disappears from the base electrode of the transistor Q12.

Accordingly, it is seen that the operation of the pulse distributor stage including the transistors Q9 and Q10 controls the stage including the transistors Q11 and Q12 in the same way as the stages of the pulse distributor in FIG. 1 control each other. The stage including transistors Q11 and Q12 may be operated by pulses applied to a terminal 112 of the OR circuit 100 or by the simultaneous application of pulses to terminals 114 and 116 of the AND circuit 102. If a pulse is applied to the terminal 112, the transistor Q14 is rendered conductive, and current flows from ground through resistor 118, the transistor Q14 and the primary winding of the transformer T6 to the negative source of operating potential. The pulse consequently induced in the secondary winding of the transformer T6 operates the stage including transistors Q11 and Q12 in the manner previously explained. If pulses are applied simultaneously to the terminals 114 and 116 of the AND circuit 102, transistors Q15 and Q16 are rendered conductive, and current flows from ground through a transistor Q16, a resistor 120, a transistor Q15 and through the primary winding of transformer T6 to the negative source of operating potential.

The operation of the AND circuit 102 may be explained very briefly. With the negative source of potential applied to the collector electrode of the transistor Q15 and with the emitter electrode of this transistor floating at some potential at or above ground, the transistor Q15 tends to conduct when a negative pulse is applied to the base electrode. As soon as the transistor Q15 conducts, the negative voltage source is applied through the primary winding of the transformer T6 and through the transistor Q15 to the collector electrode of the transistor Q16. With the collector electrode of the transistor Q16 thus energized and its emitter electrode at ground potential, this transistor remains nonconductive until a negative pulse is applied to the base electrode through the terminal 114. It is pointed out that transistor Q15 does not conduct current unless the transistor Q16 is also conductive. Likewise the transistor Q16 will not conduct unless the transistor Q15 is conductive. Accordingly, terminals 114 and 116 must be energized simultaneously in order to develop current flow from ground through the transistor Q16, the resistor 120, the transistor Q15 and the primary winding of transformer T6 to the negative voltage source of operating potential. Whenever current flows through the primary winding of the transformer T6 as a result of the simultaneous application of negative pulses to the terminals 114 and 116, the consequent pulse induced in a secondary winding of the transformer T6 operates the distributor stage including the transistors Q11 and Q12 in the manner previously explained. Thus it is seen how a logical OR circuit and a logical AND circuit may be disposed between stages of a time pulse distributor to provide additional ways by which the distributor may be controlled.

Figure 3:
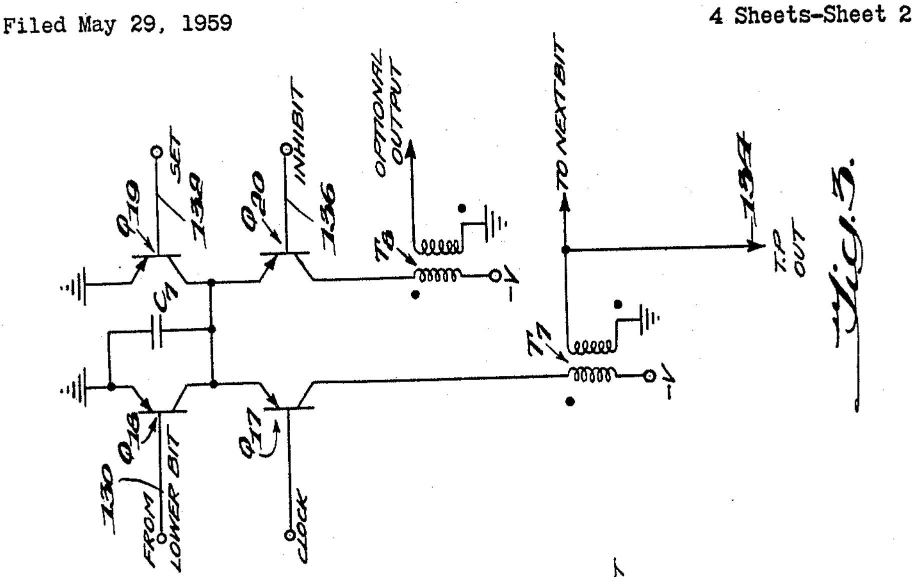
FIG. 3 illustrates a stage of a ring circuit such as illustrated in FIG. 1 but including the addition of an inhibit circuit.

Reference is made next to FIG. 3 for a description of how a logical OR circuit and a logical inhibit circuit may be incorporated in a stage of a time pulse distributor. The transistors Q17 and Q18 along with the associated condensers C7 and the transformer T7 constitute the basic components of a stage of the type illustrated and described in FIG. 1. Transistors Q19 and Q20 along with the transformer T8 have been added. The transistors Q18 and Q19 are connected in parallel, and a negative pulse applied to either line 130 or line 132 causes respective transistors Q18 or Q19 to conduct provided the condenser C7 is charged negatively, thereby discharging the condenser C7. If the condenser C7 is not charged negatively when negative pulses are applied to either the line 130 or the line 132, neither the transistor Q18 nor the transistor Q19 conducts. Accordingly, the input pulses are uneventful. If the condenser C7 is charged negatively, the collector electrodes of the transistors Q18 and Q19 are held at a negative level, and since the emitter electrodes are at the more positive ground potential, negative pulses applied to the base electrodes through the lines 130 or 132 are then effective to cause conduction of the associated transistor Q18 or Q19. It is seen therefore that the transistors Q18 and Q19 perform as a logical OR circuit in the sense that either is effective when the condenser C7 is negatively charged to discharge this condenser and thereby condition the transistor Q17 to pass the next clock pulse to the output terminal 134 of this stage.

In some instances it is desirable to inhibit clock pulses applied to the transistor Q17 from developing an output pulse at the terminal 134. For this purpose an inhibit circuit may be utilized. The transistor Q20 serves such purpose by charging the condenser C7 negatively so as to make the emitter electrode of the transistor Q17 negative and thereby prevent the passage of clock pulses to the output terminal 134. The collector electrode of the transistor Q20 is connected through the primary winding of transformer T8 to a negative source of potential, and this transistor normally remains nonconductive. If the condenser C7 is discharged, the emitter electrode of the transistor Q20 floats at some potential at or above ground, and a negative pulse applied to the base electrode through line 136 is effective to drive this transistor into current conduction. Consequently, current flows from ground through the condenser C7, the transistor Q20 and the primary winding of transformer T8 to the negative source of operating potential.

Since the condenser C7 is charged negatively in the process, the emitter electrode of the transistor Q17 is rendered negative, and the subsequent clock pulse applied to the base electrode of this transistor is ineffective to make the transistor current conductive. Accordingly, this clock pulse is inhibited from developing a pulse at the output terminal 134. Thus, it is seen how a pulse on the inhibit line 136 prevents a clock pulse from reaching the output terminal 134. Since a pulse on line 130 from the preceding stage may operate the transistor Q18 to discharge the condenser C7 and thereby permit the next clock pulse to render the transistor Q17 conductive and develop a pulse at the output terminal 134, it is necessary to supply an inhibit pulse to the line 136 immediately prior to each clock pulse and charge the condenser C7 negatively in order to insure that each clock pulse is inhibited from developing a pulse at the output terminal 134. The transformer T8 includes a secondary winding from which an output pulse may be taken for information purposes or for control purposes. This output is optional and may be dispensed with where not required.

It is seen therefore from the foregoing description of FIG. 3 that delayed pulses from the preceding stage may be applied to the line 130 to condition the transistor Q17 and permit it to pass the next clock pulse, thereby developing an output at the terminal 134. Alternatively, a pulse may be applied to the line 132 to discharg the condenser C7 and thereby condition the transistor Q17 so that it permits a clock pulse to develop a pulse at the output terminal 134. This allows the stage in FIG. 3 to pass a clock pulse at a time other than at its normal period. On the other hand, a pulse on the line 136 may be employed to inhibit the passage of clock pulses through the transistor Q17 to the output terminal 134 at any desired time including the normal period in the cycle of operation of this stage in a time pulse distributor.

Figure 4:
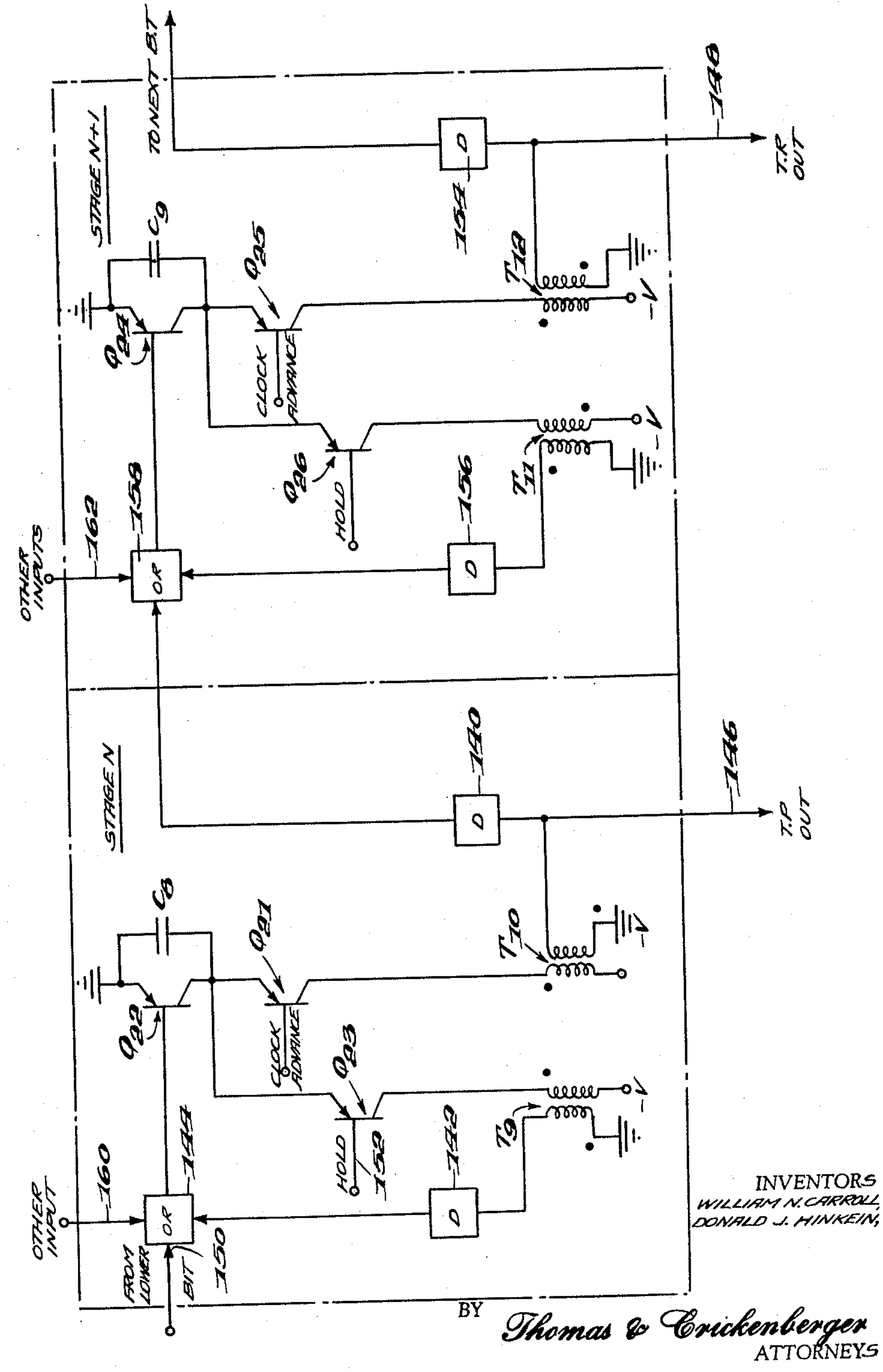
FIG. 4 illustrates two stages of a time pulse distributor of the type shown in FIG. 1 but including the addition of a holding circuit.

Reference is made now to FIG. 4 for a description of a holding circuit which will stop a time pulse distributor at any stage in its operation, inhibit output pulses for the duration of the holding operation, and automatically start the time pulse distributor at the stage where it was stopped once the holding operation is terminated. Stages N and N+1 are illustrated in FIG. 4. Transistors Q21 and Q22, the condenser C8, the transformer T10 and a delay unit 140 constitute the basic elements of a stage of a type shown and described in FIG. 1. A transistor Q23, transformer T9, delay unit 142 and OR circuit 144 are connected as shown and employed during a hold operation. A hold operation serves to suspend output pulses from the time pulse distributor even though clock pulses continue to be applied. Once the hold operation is suspended, the time pulse distributor must commence where it left off and continue its distribution of pulses on output terminals such as terminals 146 and 148 in FIG. 4.

For purposes of illustration, assume that stage N has received a pulse on conductor 150 from the preceding stage and that stage N would normally respond to the next clock pulse on the base electrode of the transistor Q21 to provide an output pulse at the terminal 146. The effect of the pulse on the conductor 150 from the preceding stage to OR circuit 144 is to drive the base electrode of the transistor Q22 negatively; this causes transistor Q22 to conduct in the saturation region and thereby discharge the condenser C8. With the condenser C8 discharged the transistor Q21 is conditioned, as previously explained with respect to FIG. 1, to become conductive and provide an output pulse to the terminal 146 when the next clock pulse is applied to the base electrode of the transistor Q21. Assume that at this point it becomes desirable to prevent further clock pulses from operating the distributor in FIG. 4. For this purpose a negative pulse is applied to the conductor 152 of stage N. The emitter of the transistor Q23 has a potential at or above ground, and the collector is at some negative level supplied by the negative source of operating voltage which may be on the order of minus 10 volts. With these levels the transistor Q23 remains nonconductive until a negative signal is applied to the conductor 152. With the application of a negative pulse on the conductor 152 the transistor Q23 conducts, and current flows from ground through the condenser C8, the transistor Q23 and the primary winding of transformer T9 to the negative source of operating potential. Consequently, the condenser C8 is charged negatively, and a negative pulse is developed in the secondary winding of transformer T9 which is applied to the delay unit 142. A negative clock pulse is subsequently applied to the base electrode of the transistor Q21 before the delayed pulse emerges from the delay unit 142. The clock pulse to the base electrode of the transistor Q21 is not passed because the condenser C8 is negatively charged and holds the emitter electrode of the transistor Q21 at or below its cut-off level. Accordingly, the clock pulse is inhibited from developing an output pulse on the terminal 146 of stage N. Subsequently the pulse delayed in the delay unit 142 emerges and passes through the OR circuit 144 to the base electrode of the transistor Q22, thereby driving this transistor into saturation and discharging the condenser C8. Consequently, the transistor Q21 again is conditioned to pass the next clock pulse.

Another hold operation may be initiated by applying a negative pulse to the base electrode of the transistor Q23 sufficiently in advance of the next clock pulse to permit the condenser C8 to be charged negatively. Accordingly, it is seen how a hold operation suspends the generation of output pulses on terminal 146 of stage N in response to clock pulses. Each of the remaining stages may be operated in like fashion during a hold operation if hold pulses are applied to each stage.

In the preceding illustration it was assumed that the condenser C8 was discharged prior to the initiation of a hold pulse on conductor 152 in stage N. There exists the possibility that the condenser C8 will be negatively charged when a hold pulse is received on the conductor 152. In this case, however, the hold pulse will be uneventful because the emitter electrode of the transistor Q23 is held sufficiently negative by the charge on the condenser to prevent conduction of the transistor Q23. Whenever the condenser C8 is charged negatively and a hold pulse is received on the conductor 152, the transistor Q21 already is disabled and cannot pass the next clock pulse so that the hold pulse on the conductor 152 is not only uneventful but not needed.

The stage $N+1$ in FIG. 4 includes transistors Q24 and Q25, condenser C9, transformer T12, and delay unit 154 which constitute the basic elements of a stage of the type illustrated and described in FIG. 1. The transistor Q26, transformer T11, delay unit 156 and OR circuit 158 are employed during a holding operation, their performance being the same as that described with respect to corresponding elements in stage N. The OR circuits 144 and 158 include respective additional input lines 160 and 162. These inputs may be employed to start a time pulse distributor at any one of its stages or to operate two or more stages of a time pulse distributor simultaneously.

Figure 5:
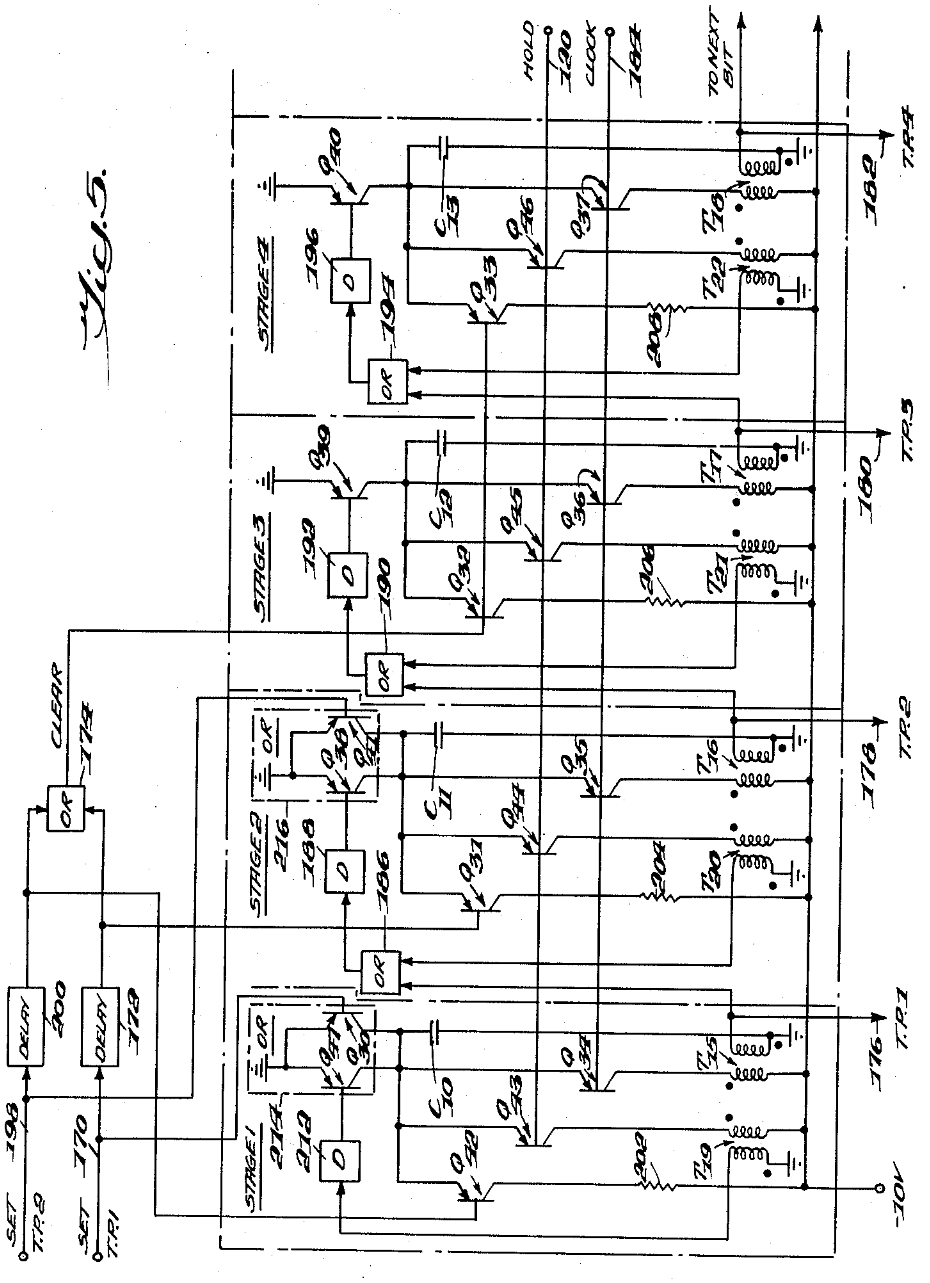
FIG. 5 illustrates a non-ring type time pulse distributor constructed according to the present invention which includes a holding circuit in each stage and further illustrating a provision for initially setting the distributor selectively at any one of a predetermined number of stages.

Reference is made to FIG. 5 for a description of a time pulse distributor which is not the closed ring type and which has provisions for starting at the first or second stages selectively. This time pulse distributor has equipment for effecting a holding operation whereby output pulses may be inhibited for one or more clock pulses and the distributor automatically started again at the stage where the operation was stopped. Stages 1 through 4 are shown for illustrative purposes, but is to be understood that the number of stages employed may be increased or decreased as needed. Since the component parts of the various stages have been described in various ones of the preceding figures, it is not necessary to repeat that description here, and the operation of this embodiment as a pulse distributor is given instead, various differences from the standpoint of control being pointed out as the description proceeds.

If it is desired to start the time pulse distributor at the first stage, a negative pulse is applied to a conductor 170 which energizes the base electrode of a transistor Q30 and a delay unit 172. If the condenser C10 is charged negatively, the pulse at the base electrode of the transistor Q30 is effective to render the transistor conductive and thereby discharge this condenser. It is pointed out that the transistor Q30 is connected in parallel with the condenser C10 and serves to short both terminals of the condenser C10 to ground, thereby discharging this condenser. In case the condenser C10 holds no charge, the condenser is then in the desired state, and the negative pulse at the base electrode of the transistor Q30 is ineffective. The pulse which emerges from the delay unit 172 is applied to the base electrode of a transistor Q31 which is rendered conductive and charges the condenser C11 negatively. The delayed pulse from the delay unit 172 further is applied through an OR circuit 174 to the base electrodes of transistors Q32 and Q33 which in turn renders these transistors conductive and charges respective condensers C12 and C13 negatively. Accordingly, the condenser C10 is discharged and the condensers C11, C12 and C13 are charged negatively in response to the pulse applied to the conductor 170. In this condition stage 1 is set and stages 2, 3 and 4 are cleared so that the next clock pulse establishes an output pulse at terminal 176 of stage 1 but not at terminals 178, 180 and 182 of respective stages 2, 3 and 4.

In order to demonstrate this, assume that a clock pulse is applied to conductor 184. The base electrodes of transistors Q34, Q35, Q36 and Q37 are driven negatively. Consequently, the transistor Q34 is the only one rendered conductive since its emitter electrode is at or above ground potential; the transformer T15 is energized; and an output pulse is developed at the terminal 176. This clock pulse on the line 184 drives the base electrodes of the transistors Q35, Q36 and Q37 negatively. However, the emitter electrodes of these transistors are held at a negative level by the charged condensers C11, C12 and C13 respectively so that these transistors do not conduct. Hence, the associated transformers T16, T17 and T18 are not energized, and no output pulse is developed on any one of the corresponding terminals 178, 180 or 182. The output pulse which appears at the terminal 176 of stage 1 is applied through an OR circuit 186 in stage 2 to a delay unit 188, and when the output pulse at terminal 176 terminates, the delayed pulse emerges from the delay unit 188 and energizes the base electrode of transistor Q38. The base electrode of transistor Q38 is driven negatively, and since the emitter electrode of this transistor is at the more positive ground potential and the collector electrode at a negative level determined by the charge on condenser C11, this transistor is driven into conduction in its saturation region. Consequently, the negative upper terminal of the condenser C11 is shorted to ground, thereby discharging this condenser. When the negative pulse at the base electrode of the transistor Q38 terminates, this transistor returns to its nonconductive state and is effectively an infinitely high impedance or an open circuit. At this point stages 1, 3 and 4 are cleared whereby they will not pass the next clock pulse, and stage 2 is set so that it will pass the next clock pulse.

The next clock pulse on line 184 causes the transistor Q35 to conduct, charging the condenser C11 negatively and developing an output pulse from the transformer T16 to the output terminal 178. The output pulse from stage 2 is passed through an OR circuit 190 and a delay unit 192 to the base electrode of transistor Q39; whereupon this transistor conducts and discharges the condenser C12. At this point in the cycle of the time pulse distributor, stages 1, 2 and 4 are cleared so as to prevent the next clock pulse from reaching their output terminals, and stage 3 is set so as to permit the next clock pulse to reach its output terminal.

The next clock pulse causes the transistor Q36 to conduct, thereby charging the condenser C12 negatively and energizing the transformer T17 to develop an output pulse at terminal 180. The output pulse from stage 3 is applied through an OR circuit 194 and a delay unit 196 to the base electrode of transistor Q40 whereby this transistor is rendered conductive and the condenser C13 discharged. At this point in the cycle of the time pulse distributor in FIG. 5 the first three stages are cleared to prevent the next clock pulse from reaching their output terminals, and stage 4 is set so that the next clock pulse may develop an output signal at its terminal 182.

The next clock pulse renders the transistor Q37 conductive, thereby charging the condenser C13 negatively, energizing the transformer T18 and establishing an output pulse at the terminal 182. At this point in the cycle of the time pulse distributor in FIG. 5, stages 1 through 4 are cleared so that no further clock pulses are passed by any one of these stages, and the time pulse distributor has completed its cycle of operation. In this connection it should be noted that the time pulse distributor is not connected as a closed ring as was the case in the time pulse distributor illustrated and described in FIG. 1.

In certain types of control devices for information handling systems and comparing devices it is desirable in some instances to be able to operate a time pulse distributor by skipping one or more stages. For instance, in a particular operation output pulses from the first five stages of a ten stage distributor may not be required in which case time can be saved by starting the distributor at stage 6. This type of operation is illustrated in FIG. 5 by skipping stage 1 and setting stage 2 so that the time pulse distributor operates stages 2, 3 and 4 and then stops.

In order to illustrate this assume a negative pulse is applied to line 198. This pulse drives the base electrode of transistor Q41 negatively, and if the condenser C11 is negatively charged, the transistor Q41 is driven into the saturation region of conduction and discharges this condenser. If the condenser C11 should be discharged at this time, it is in the desired condition, and the negative pulse at the base electrode of the transistor Q41 is uneventful. In either case the second stage is set so that the next clock pulse on line 184 develops an output pulse at terminal 178 in stage 2. The pulse on line 198 further is applied to a delay unit 200, and the pulse which emerges from the delay unit 200 drives the base electrode of the transistor Q42 negatively, causing it to conduct and charge condenser C10 negatively. Hence, stage 1 is cleared so as not to pass the next clock pulse. The delay pulse from the delay unit 200 also passes through the OR circuit 174 and drives the transistors Q32 and Q33 into conduction if their associated condensers are discharged, thereby charging associated condensers C12 and C13 negatively. The resistors 202, 204, 206 and 208 serve as current limiting resistors during a clearing operation. At this point the stages 3 and 4 are cleared so that neither will pass the next clock pulse. Accordingly it is seen that a pulse on the conductor 198 clears stages 1, 3 and 4 so that they will not pass the next clock pulse, and sets the stage 2 so that it will not pass the next clock pulse. The first subsequent clock pulse is passed by stage 2, and succeeding clock pulses are passed by stages 3 and 4 as previously explained. Thus in progressing through this cycle of operation the time pulse distributor in FIG. 5 skips stage 1 and develops output pulses from stages 2, 3 and 4.

In certain controlling devices for computer systems and information handling systems it is sometimes desirable to suspend operation of a time pulse distributor at some point during its cycle and to commence at the same point in its cycle at a subsequent time. When such action is desired, one or more hold pulses, depending upon the period of the holding operation, are applied to conductor 120.

In order to illustrate this holding operation, assume that the time pulse distributor in FIG. 5 has progressed through its cycle to stage 3 whereby condenser C12 is discharged and condensers C10, C11 and C13 are negatively charged. Assume further that a holding operation is desired and that a hold pulse on the conductor 120 is received prior to the next clock pulse on the conductor 184. The hold pulse on the conductor 120 drives the base electrode of transistors Q43, Q44, Q45 and Q46 negatively. Since the condensers C10, C11 and C13 are negatively charged, their associated transistors Q43, Q44 and Q46 accordingly are not rendered conductive. Because the condenser C12 is discharged at this instant, the transistor Q45 conducts, thereby charging the condenser C12 negatively and developing a negative pulse at the output from the secondary winding of transformer T21. This pulse is applied through the OR circuit 190 to the delay unit 192. Subsequently a clock pulse arrives on the conductor 184, but it is unable to operate any of the transistors Q34, Q35, Q36 or Q37 because their associated condensers C10, C11, C12 and C13 are each charged negatively. Accordingly the clock pulse is inhibited from reaching any one of the output terminals 176, 178, 180 or 182. After the clock disappears from the line 184, the delayed pulse in the delay unit 192 emerges, and this is a negative pulse which drives the transistor Q39 into its saturation region of conduction. Consequently the condenser C12 is discharged and the stage 3 is set so as to pass the next clock pulse. The holding operation may continue so long as hold pulses are received on the conductor 120 sufficiently in advance of each clock pulse to permit the transistor Q45 to charge the condenser C12 negatively. When it is desired to terminate the holding operation, no further hold pulses are applied to the line 120. The subsequent clock pulse is effective to render the transistor Q36 conductive, to charge the condenser C12 and to develop an output pulse at the terminal 180 which is also applied to stage 4 so as to set this stage. The next clock pulse on terminal 184 operates the transistor Q37 to develop an output pulse on the terminal 182, and the time pulse distributor has then completed its cycle of operation.

Accordingly, it is seen how the holding operation is effective to stop output pulses when the time pulse distributor is at stage 3 and to start output pulses at a subsequent point in time when hold pulses are terminated. The time pulse distributor commences at stage 3 and proceeds to complete its cycle of operation by developing output pulses from the terminals 180 and 182 of respective stages 3 and 4 in response to subsequent clock pulses.

If the holding operation takes place when stage 1 is set, the transistor Q43, transformer T19, the delay unit 212 and transistor Q47 operate to perform the holding operation as explained with respect to stage 3. If the holding operation occurs when stage 2 is set, the transistor Q44, transformer T20, OR circuit 186, delay unit 188 and transistor Q38 perform the holding operation as described with respect to stage 3. In like fashion, the elements in stage 4 which perform the holding operation include the transistor Q46, transformer T22, OR circuit 194, delay unit 196 and transistor Q40. Stages 1 and 2 include OR circuits 214 and 216 respectively. The OR circuit 214 includes the transistor Q47 employed during a holding operation and the transistor Q30 employed when initially setting stage 1 of the time pulse distributor for a new cycle of operation. Similarly, OR circuit 216 includes the transistor Q38 employed during a holding operation involving stage 2 and the transistor Q41 employed when setting the time pulse distributor to commence a new cycle of operation from stage 2, skipping stage 1.

It is seen therefore that a unique arrangement of relatively few components provides a time pulse distributor which operates with good reliability at high speeds, uses a minimum of power, eliminates the need for the customary flip-flop circuits, and requires no D.C. battery type bias for control purposes. Further, the distributor may be used with various logical circuits to provide added flexibility of its control, and the distributor may be stopped at any stage in its cycle of operation and later started at this stage.

What is claimed is:

1. A pulse distributor having a group of stages with each stage including a condenser, a first transistor connected across the condenser, a second transistor connected in series with the condenser, a source of operating potential, a transformer having a primary winding connected between the second transistor and the source of operating potential, the transformer having a secondary winding connected to an output terminal, a first delay unit connected between the output terminal and the first transistor of the succeeding stage, a source of clock pulses coupled to the second transistor and serving to operate the second transistor and develop a pulse on the output terminal to a load device whenever the condenser is discharged, the output pulse being further applied to the delay unit and being delayed therein until the clock pulse applied to the second transistor terminates after which the delayed pulse is applied to the first transistor of the next stage to operate this transistor and discharge the condenser of that stage.

2. A pulse distributor comprising a plurality of stages each of said stages containing a capacitive storage device, a first transistor connected in parallel with said capacitive storage device to discharge said storage device, a second transistor in series with said capacitive storage device to charge said capacitive storage device, a coupling device, a voltage source, said coupling device and said voltage source serially connected with said second transistor, an output conductor connected to said coupling means, a delay means connected between said coupling means and said first transistor of said succeeding stage so that when said second transistor charges said capacitive storage means in one stage a pulse passes through said coupling means to said output conductor and said delay means and subsequently emerges from said delay means causing said first transistor of said succeeding stage to discharge said associated capacitive storage device, and a source of clock pulses applied to the second transistor of each of the stages to cause said second transistor to charge its associated capacitive storage device if said capacitive storage device is in the non-charged state.

References Cited in the file of this patent

UNITED STATES PATENTS

| | | |
|---|---|---|
| 2,638,542 | Fleming | May 12, 1953 |
| 2,719,225 | Morris | Sept. 27, 1955 |
| 2,760,087 | Felker | Aug. 21, 1956 |
| 2,778,006 | Guterman | Jan. 15, 1957 |
| 2,782,344 | Sharin | Feb. 19, 1957 |
| 2,831,985 | Eckert | Apr. 22, 1958 |
| 2,861,216 | England | Nov. 18, 1958 |
| 2,910,596 | Carlson | Oct. 27, 1959 |
| 2,970,294 | Guterman | Jan. 31, 1961 |
| 2,985,835 | Stuart | May 31, 1961 |
| 3,024,446 | Kornfield | Mar. 6, 1962 |
| 3,046,530 | Kelner | July 24, 1962 |

FOREIGN PATENTS

| | | |
|---|---|---|
| 769,704 | Great Britain | Mar. 13, 1957 |
| 1,051,906 | Germany | Mar. 5, 1959 |

OTHER REFERENCES

"Arithmetic Element of the I.B.M. Type 701 Computer," by Ross, published in the October 1953 Proceeding of the I.R.E., page 1290.